United States Patent [19]

Josephs

[11] Patent Number: 5,136,239
[45] Date of Patent: Aug. 4, 1992

[54] APPARATUS FOR MEASURING FLUX AND OTHER HYSTERETIC PROPERTIES IN THIN FILM RECORDING DISCS

[76] Inventor: Richard M. Josephs, 220 Limestone La., Willow Grove, Pa. 19090

[21] Appl. No.: 515,715

[22] Filed: Apr. 27, 1990

[51] Int. Cl.[5] .............. G01R 33/14; G01R 33/06; G01N 27/72; G11B 3/00
[52] U.S. Cl. .................... 324/210; 324/225; 324/235; 324/223; 324/251; 369/58; 360/112
[58] Field of Search ............... 324/210-212, 324/222, 223, 235, 251, 239-243, 225; 369/58; 360/112; 307/309

[56] References Cited

U.S. PATENT DOCUMENTS 3,359,495  12/1967  McMaster et al. ............ 324/235
4,843,316   6/1989  Hesterman .................. 324/210

OTHER PUBLICATIONS

Magnetic Recording; C. D. Mee and E. D. Daniel; McGraw-Hill Book Co. ©1987; pp. 22-27 @Eq. (2.3b).
Magnetic Force Microscopy; General Principals etc. D. Rugar et al.; J. Appl. Phys 68(3); Aug. 1990; pp. 1169-1183 Eq (14) @1178.
Remanence and Longitudinal Recording . . . ; R. G. Simmons; IEEE Trans on Mag. vol. 26, No. 1, Jan. 1990; pp. 93-96 169 p. 93.
"A Hall Sensing Magnetometer for Measuring, Anisotrory, Rotational Loss and Time Effects", IEEE Transactions on Magnetics, vol. MAG-21, No. 5, Sep. 1985; by P. J. Flanders.

*Primary Examiner*—Walter E. Snow
*Attorney, Agent, or Firm*—John B. Sowell

[57] ABSTRACT

Apparatus for measuring hysteretic properties of thin film recording disks is provided which comprises a magnetic field generator for magnetizing a spot on a piece of magnetic material to be tested. The magnetized spot is moved past a stationary Hall effect sensor which detects the magnetic flux being emitted from the magnetized spot. The process of magnetizing and detecting the flux emitted from the same spot is repeated at different magnetization levels to provide a set of automatic measurements that are recorded in a memory of a controller processor. An analysis of the recorded data permits the automatic computation of residual flux, remanent coercivity, switching field distribution as well as other hysteretic properties.

18 Claims, 6 Drawing Sheets

APPARATUS FOR MEASURING FLUX AND OTHER HYSTERETIC PROPERTIES IN THIN FILM RECORDING DISCS

BACKGROUND OF THE INVENTION

1. Field of the Invention

The present invention is related to testing apparatus for non-destructive testing of hysteretic properties of magnetic sheets. More particularly, the present invention relates to a single apparatus adapted to measure flux (Mrt), remanent coercivity (Hrc), switching field distribution (S*) as well as the parameters usually measured from a hysteresis loop such as coercivity (Hc) and loop shape.

2. Description of the Prior Art

My U.S. Pat. No. 4,816,761 issued Mar. 28, 1989, for "Apparatus for Measuring the Hysteresis Loop of Hard Magnetic Films on Large Magnetic Recording Disks". This apparatus was adapted to measure the hysteretic properties in the presence of an applied field. However, this apparatus could not measure the vertical axis of the hysteresis loop in absolute electromagnetic units (emu), thus, was incapable of measuring the magnetic flux in the magnetic sheets being tested. Apparatus for sensing flux in magnetic sheet material is described in IEEE Transaction on Magnetics, Vol. MAG-21, No. 5, Sep. 1985 at pages 1584 to 1589 entitled "A Hall Sensing Magnetometer for Measuring Magnetization, Anisotropy, Rotational Loss and Time Effects", by P. J. Flanders. This article explains that it is possible to measure flux of a small sample which is placed in a magnetic field with a Hall effect sensor so that only the magnetization of the sample is detected and not the field being applied to the sample. Alternatively, two identical Hall effect sensing elements may be placed in the presence of the applied magnetic field with the sample under test and electrically connected in series opposition so as to cancel out the effect of the applied field. In summary, the above apparatus is limited to testing small samples of magnetic materials that could be placed in an applied magnetic field such as that generated in the gap between two current carrying coils or in the small gap of a ring magnet.

My U.S. Pat. No. 4,816,761 was capable of measuring in an non-destructive fashion, using the magneto-optic Kerr effect, to determine the coercivity and hysteresis loop shape of magnetic samples. The latter article by P. J. Flanders describes a method of measuring the flux of a small sample employing a Hall effect magnetometer. To use this prior art method on large magnetic recording disks or sheets, it is necessary to cut the magnetic material into coupons or chips small enough to fit into the gap of a conventional electromagnet or the gap between current carrying coils.

There are a known variety of non-destructive techniques for measuring the flux of magnetic samples, all of which depend on the use of applications of Faraday's Law, i.e. the time variation of the sample flux detected by a playback recording head. When using the inductive playback recording head method, the sample must be moving at high speed in very close proximity to the playback head as occurs in magnetic disk systems. The distance that such heads are spaced from the magnetic sample is approximately 5 micro inches or 0.125 microns. Further, the requirement for the critical speeds and spacing using such inductive tests in not conducive to using this method in a manufacturing environment.

It would be desirable to provide an economic, predictable and repeatable non-destructive flux measuring apparatus that does not employ relative motion inductive techniques. Further, it would be desirable to provide a novel non-destructive Hall effect magnetometer to measure flux in magnetic layers such as occurs in disks, tapes and magnetic sheets. It would be desirable that the novel apparatus and method would be adapted to measure the hysteretic properties of moving magnetic steel sheets such as transformer sheet steel.

3. Summary of the Invention

It is a principal object of the present invention to provide apparatus for non-destructive testing of magnetic sheet materials.

It is another principal object of the present invention to provide apparatus for testing thin film magnetic recording disks during continuous production operations.

It is another principal object of the present invention to rapidly and efficiently measure the flux, remanent coercivity and switching field distribution employing a single set of remanent flux measurements.

It is another principal object of the present invention to provide flux measuring apparatus in which the distance between the magnetic material under test and the sensor is relatively large.

It is another principal object of the present invention to provide an apparatus in which the distance between the magnetic material and the magnetic field generator is also relatively large.

It is a general object of the present invention to provide flux testing apparatus in which the velocity or speed of movement of the magnetic material relative to the sensor is not critical to the measurement of the hysteretic properties.

It is a general object of the present invention to provide apparatus for measuring the flux and other hysteretic properties of a magnetic material using one or more galvanomagnetic Hall effect sensors or magnetoresistors.

It is another general object of the present invention to provide an economic and reliable simplified apparatus for measuring hysteretic properties of stationary or moving sheet materials.

According to these and other objects of the present invention, there is provided a magnetic field generator for magnetizing a spot on a piece of magnetic material to be tested. The magnetic spot is preferably moved past a stationary Hall effect sensor which detects the magnetic field emanated from the magnetic sample. The process of magnetizing a spot on a sample and detecting the field emanating from the same spot is repeated at different magnetization levels to provide a set of automatic measurements that are recorded in a memory of a controller or a computer. An analysis of the recorded data permits the automatic computation of the remanent flux, remanent coercivity and switching field distribution as well as other hysteretic properties to be explained hereinafter.

DESCRIPTION OF THE PREFERRED EMBODIMENTS

Figure 1:
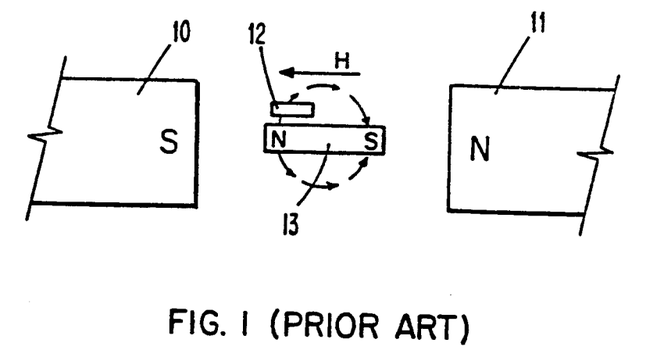
FIG. 1 is a schematic drawing of a prior art flux measuring apparatus employing a Hall effect sensor to measure a small sample of magnetic material.

Refer now to FIG. 1 showing magnetic field generation means 10, 11 which may comprise a pair of current carrying coils or a ring shaped electromagnet which generates a field H in the gap of the coil or electromagnet 10, 11. Placed in the magnetic field, in the gap, there is positioned a small sample of magnetic material 13 which has been magnetized so as to produce some external flux, as indicated by the lines and arrows between the north and south poles. A Hall effect sensor 12 is positioned horizontally near the end of the magnetic material 13, and in close proximity thereto, in the horizontal plane so that the flux passes through the sensor 12. If the Hall effect sensor 12 is not positioned very accurately in the field H, the sensor will detect not only the flux of the sample 13 but part of the applied flux field H from the magnetic generator means 10, 11. This prior art Hall effect flux sensing apparatus requires a high magnetic field H when testing hard magnetic materials with high coercivities such as is found in thin film magnetic recording disks.

Figure 2:
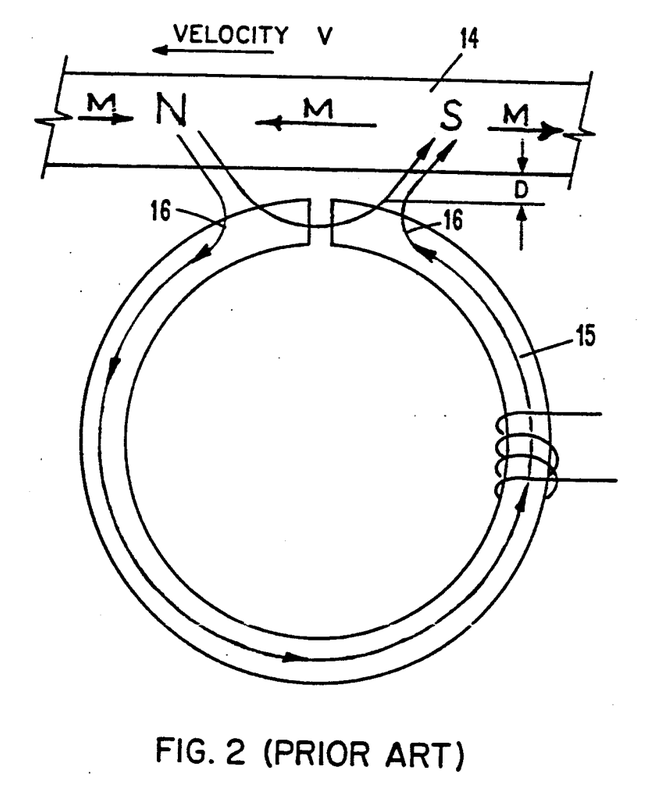
FIG. 2 is a schematic drawing of a prior art playback recording head in close proximity to a high speed moving disk which is capable of inductively sensing the flux in the disk.

Refer now to FIG. 2 showing a prior art playback-recording head 15 in close proximity to a high speed moving disk 14. The magnetic material 14 is shown having north and south poles which were written by the recording head 15 while the magnetic material 14 was moving. When the electromagnetic field is removed, the head 15 becomes a playback head which senses the magnetic flux lines 16 as they rapidly pass the gap of the playback head. Such recording and playback heads have extremely small gaps and the distance D between the playback and recording head and the magnetic material is approximately 5 micro inches in the present state of the art thin film disk recording systems. When sensing the flux 16 resulting from magnetization M in the magnetic material 14, the signal detected is velocity sensitive and is also sensitive to the space D between the recording head and the magnetic material. Heretofore, flux sensing apparatus has been described in the prior art using playback and recording heads of the type used in modern recording systems. If the critical parameters of distance D and velocity V are well controlled, it is possible to obtain accurate flux measurements. However, setting up such apparatus for production testing is neither economically feasible or practical.

Figure 3:
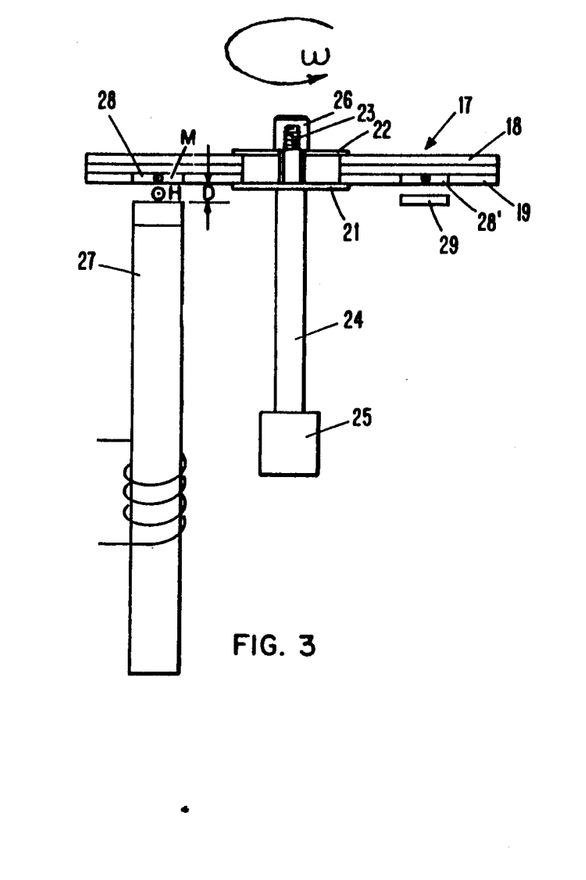
FIG. 3 is a schematic drawing and front elevation of a typical high density recording disk showing a magnetic spot generator and a Hall effect sensor.

Refer now to FIG. 3 showing a front elevation of a preferred embodiment flux testing apparatus for testing a typical high density recording disk 17. The magnetic layers 18 and 19 of the magnetic disk 17 are shown exaggerated in thickness to assist in more easily describing the principle of operation of the testing device. The magnetic disk 17 is shown clamped between flange plates 21 and 22 and mounted on a threaded spindle 23 formed as an extension of shaft 24 of stepper motor 25. A knurled cap nut 26 may be employed to position the recording disk 17 at a precise distance D from the gap at the top of electromagnet 27. The flux H generated by the electromagnet 27 is shown coming out of the plane of the paper so as to magnetize a spot 28 of the magnetic layer in the same direction as the field H. The distance D between the top of the gap of electromagnet 27 and the bottom of the magnetic layer 19 is typically 50 one thousandths of an inch which is approximately 10,000 times greater than the comparable distance between the recording head 15 and the magnetic material 14 referred in FIG. 2 employing an inductive testing principle. Further, the electromagnet 27 is typically approximately one foot in diameter employing a magnetic gap of approximately ⅛th of one inch so as to produce magnetic fields of the order of magnitude of 6,000 to 10,000 oersteads needed to saturate the spot 28 of a magnetic recording disk layer. When the magnetized spot 28 is rotated 180° in the direction shown by the rotational arrow omega, the spot 28 shown as spot 28', is positioned opposite a Hall effect sensor 29.

In a preferred mode of operation, the field of the electromagnet 27 is applied to generate a magnetized spot 28 and then turned OFF. The magnetic spot 28 is rotated to the position shown at 28' and the flux is sensed by the sensor 29. This identical same spot is returned to the position 28 and magnetized at a different level and returned to the sensor 29 to produce a set or series of flux level readings from which the hysteretic properties of the magnetic material 19 can be determined.

Figure 4:
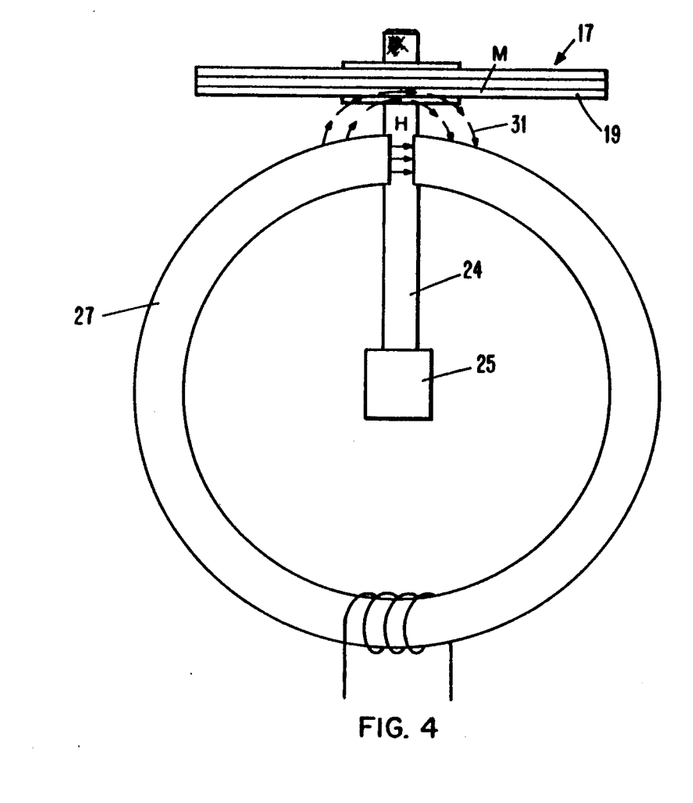
FIG. 4 is a schematic drawing and side elevation of the recording disk and magnetic spot generator shown in FIG. 3.

Refer now to FIG. 4 showing a side elevation of the magnetic spot generator 27 and the magnetic recording disk 17 shown in FIG. 3. This figure shows the flux lines 31 which thread through the magnetic layer 19 and magnetize the magnetic spot 28 in a repeatable manner.

Figure 5:
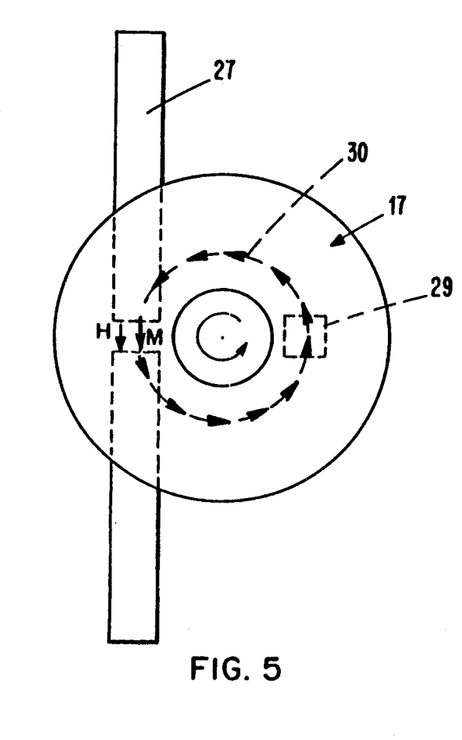
FIGS. 5, 6 and 7 are schematic drawings and top view showing the recording disk at three different positions relative to the magnetic spot generator and the Hall effect sensor.
Figure 6:
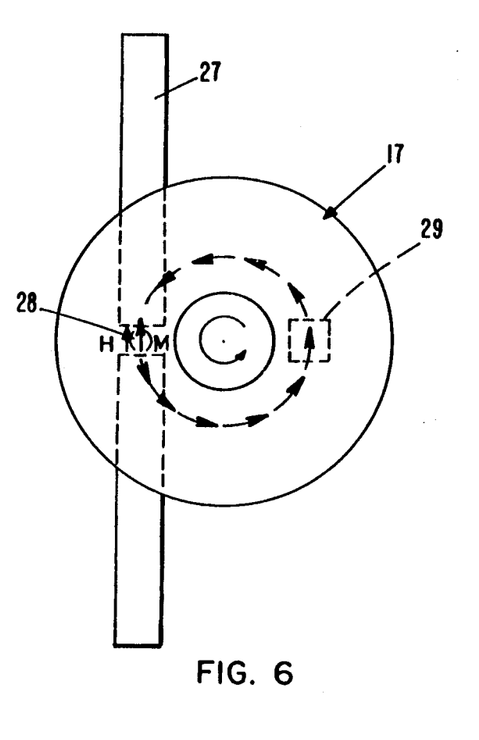
Figure 7:
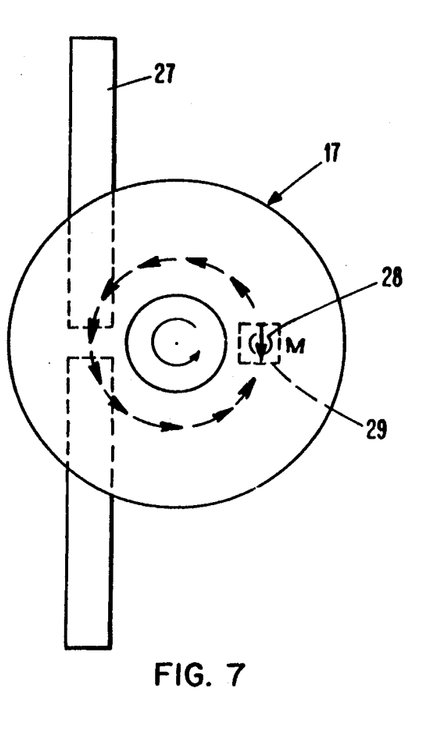

Refer now to FIG. 5, 6 and 7 showing top views of the recording disk 17 at three different rotational positions relative to the magnetic spot generator 27. Generator 27 is activated so as to generate a magnetic field H sufficient to saturate the magnetic layer 19. The disk 17 is rotated in the presence of this field to complete a 360° saturated annular ring on the magnetic disk 17. With the rotation of the disk 17 ceased, a magnetic field H of opposite direction to the previously saturating field is applied at spot 28 as shown in FIG. 6. This may be considered a write operation in recording technology. After turning OFF the spot generating means write field, the magnetized spot 28 is now oriented in the opposite direction to the annular ring 30 which was previously recorded in FIG. 5. With the generator 27 deactivated, the recording disk is now rotated so that the magnetized spot 28 is positioned directly over the sensor 29 and the controller or computer means associated with the apparatus activates the sensor to read the residual flux in the magnetic layer 19. This sequence of operations is repeated for increasing or decreasing values of field H produced by the generator means 27 to write the spot at different flux levels.

Figure 8:
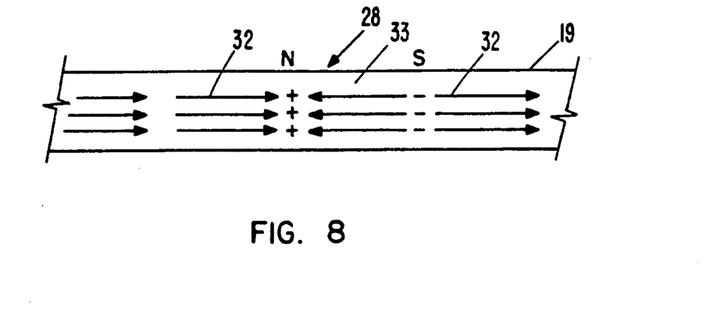
FIG. 8 is a schematic drawing and partial section of a magnetic spot of the type produced on a recording disk being tested.

Refer now to FIG. 8 showing a schematic drawing of a magnetic spot 28 of the type recorded in layer 19 on recording disk 17 to be tested. The magnetic layer 19 is shown having magnetic vectors 32 directed to the right hand direction and magnetic vectors 33 directed in the left hand direction. The region between the magnetization vectors 32 and 33, where the heads of the arrows are in opposition, is shown as plus orientation or north polarity poles whereas the region of the tails is shown as having negative orientation or south polarity. Thus, it will be understood that the spot 28 to be detected is the region of vectors 33 shown between the north and south oriented poles.

Figure 9:
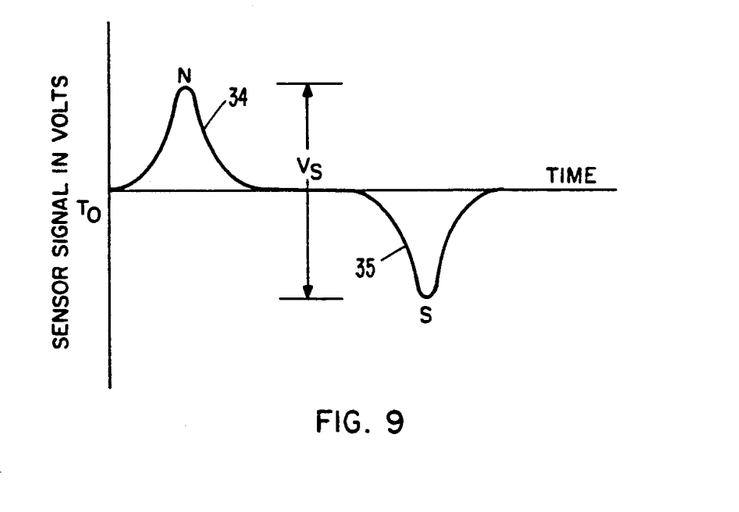
FIG. 9 is a waveform diagram of the signals sensed by the Hall effect sensor.

Refer now to FIG. 9 showing a waveform diagram of the signals sensed by the Hall effect sensor when the spot 28 passes over the Hall effect sensor 29 as shown in FIG. 3. FIG. 9 shows a positive wave form 34 which is generated when the north or plus poles pass over the sensor 29. It is important to note that the magnitude of the sensor signal in volts is not dependent on the velocity of movement of the magnetic disk 17. In similar manner when the south or negative poles pass over the sensor 29, a waveform 35 is produced and the peak to peak value of these waveforms 34 and 35 is shown as the voltage signal $V_s$. Different applied magnetic field strengths will produce different strength magnetic vectors 32 and 33 until the magnetic layer 19 reaches a saturation value. Even though the abscissa of FIG. 9 is shown as a time value, it is well to note that the detecting, sensing or recording of the peak values 34 and 35 is not dependent on the velocity of movement of the magnetic layer 19.

Figure 10:
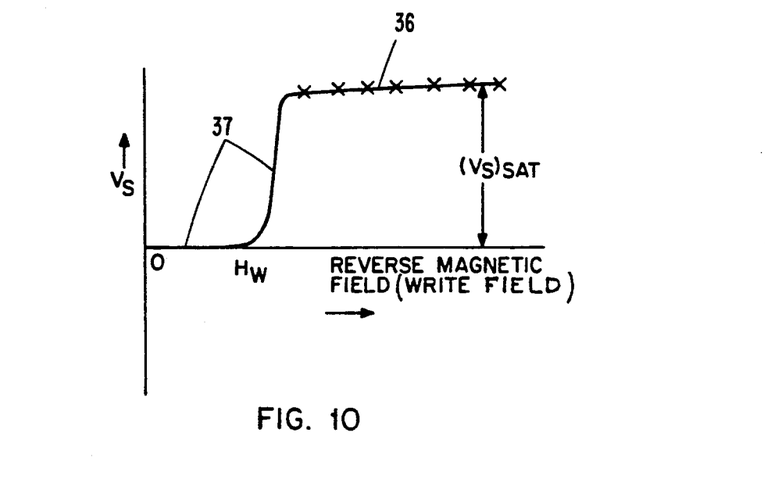
FIG. 10 is a schematic diagram of voltage signal values sensed for different magnetic field values.

FIG. 10 shows a schematic diagram plot of the different voltage signal values $V_s$ sensed for different applied magnetic field values. The vertical axis shown as $V_s$ starts at a value zero that stays substantially at zero until it reaches a minimum magnetic write field value which is capable of reducing the magnetization magnitude magnetic vectors 32. As the write field increases, the magnetization assumes the direction of the written vectors 33. The reverse magnetic field shown as $H_W$ is increased in magnitude until the magnetic layer 19 becomes substantially saturated as shown at portion 36 as the saturated region of the waveform. The voltage signal saturation value shown as $(V_s)$ sat is directly proportional to the remanent flux which is equal to (Mrt). The remanent coercivity (Hrc) and the switching field distribution (S*) may be calculated from the data shown in portions 36 and 37 of the waveform data shown in FIGS. 9 and 10.

Figure 11:
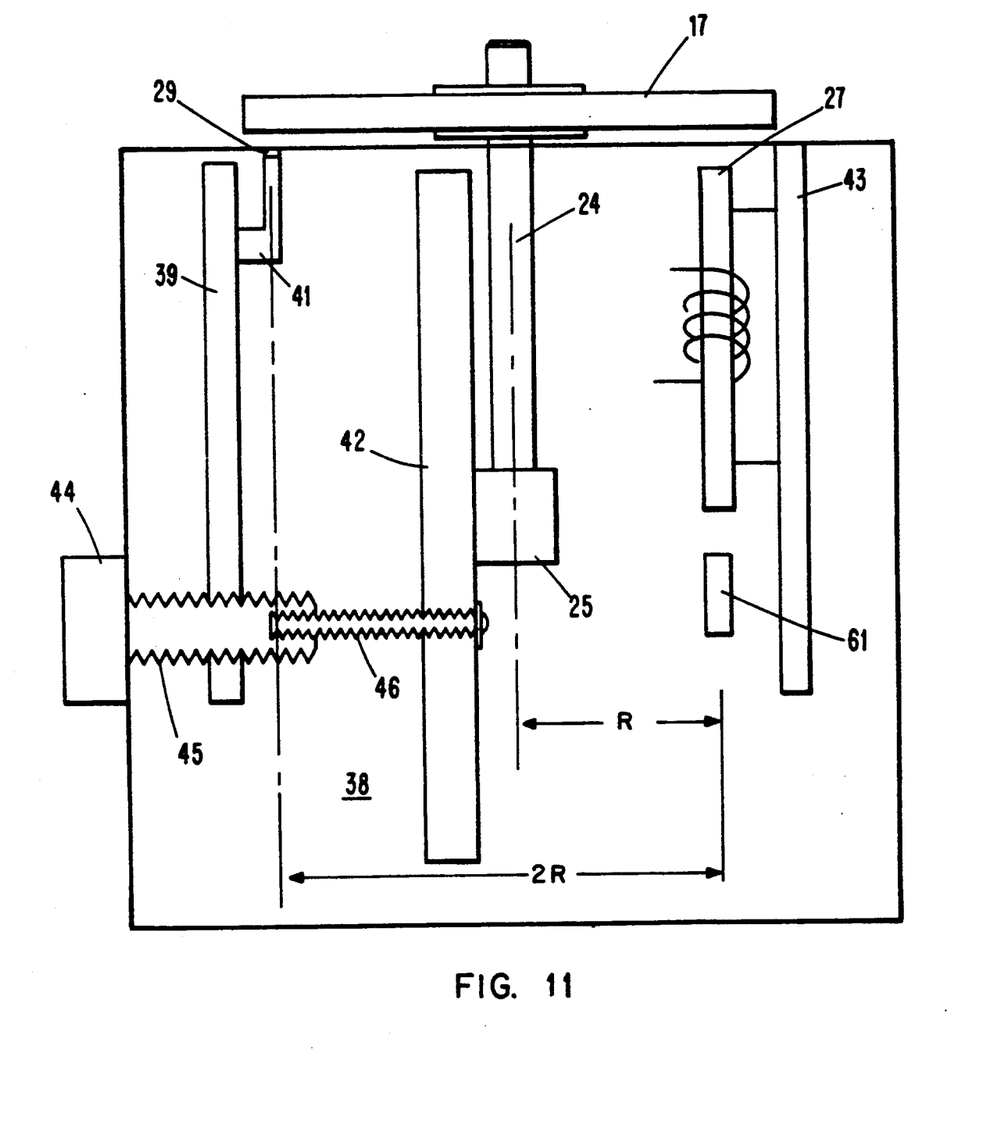
FIG. 11 is a schematic diagram and side elevation of a modified apparatus of the type shown in FIG. 3 for testing spots at different radii of a recording disk.

Refer now to FIG. 11 showing in side elevation a modified apparatus of the type shown in FIG. 3. The testing apparatus 38 is shown having a motor 25 and shaft 24 for rotating a recording disk 17. Instead of having a fixed position sensor 29, the sensor is mounted on a movable vertical plate 39 having a upward dependent support arm 41 for supporting the Hall effect sensor 29 thereon. A second movable verticale plate 42 supports the aforementioned motor and shaft 25, 24. The magnetic spot generator 27 is shown in a fixed position mounted on a vertical plate 43. A plate drive motor 44 directly drives a lead screw 45 which threads into plate 39. Lead screw 45 has an internally threaded female aperture which receives a male lead screw 46 fixed to vertically movable plate 42. The threads on lead screw 46 are exactly one-half the pitch of the threads on lead screw 45. Thus, plate 42 moves only one-half as fast horizontally as the vertical plate 39 due to movement of lead screw 45.

The reason for having plates 39 and 42 move relative to the spot generator 27 at different rates of movement is to permit the fixed spot generator 27 to generate spots at different radial positions on recording disk 17 and permits the sensor 29 to be in the correct position for sensing the flux of the last generated spot.

Figure 12:
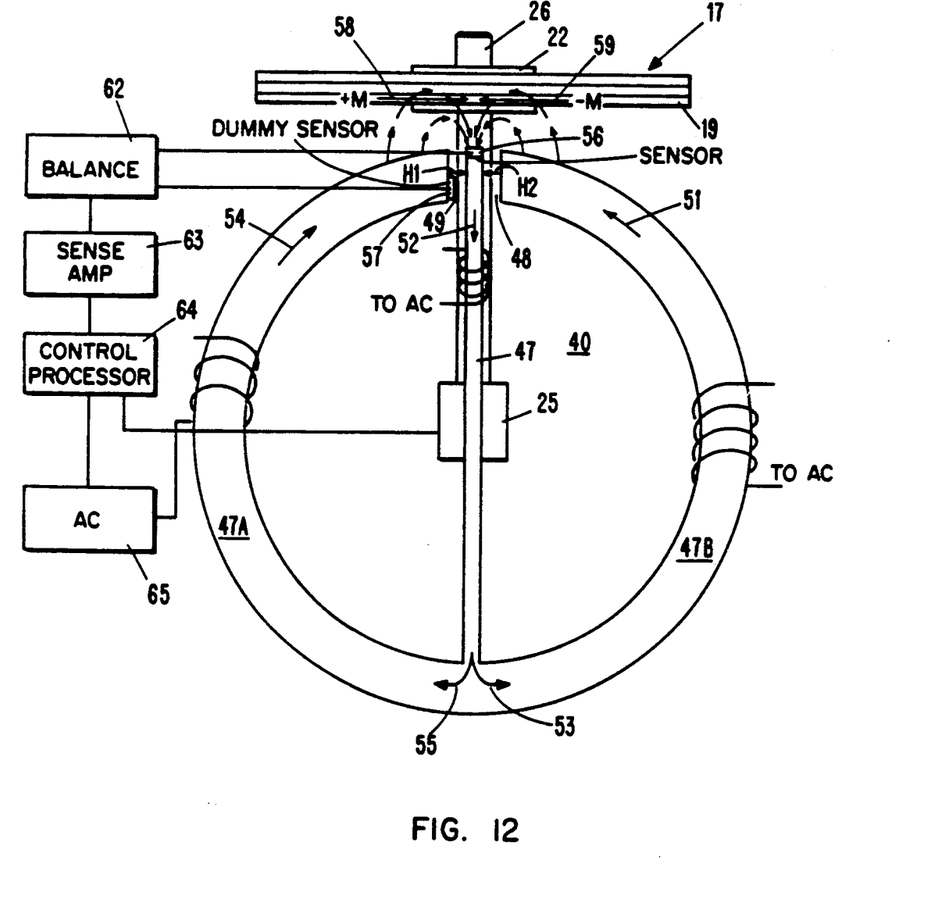
FIG. 12 is a schematic diagram and side elevation of a novel spot generator comprising a double gap electromagnet apparatus which does not require movement of the recording disk to detect the residual flux therein.

Refer now to FIG. 12 (and to FIG. 11) showing a side elevation of a novel spot generator 40 comprising a double gap electromagnet which eliminates the requirement of movement of the recording disk as will be explained hereinafter. Spot generation means 40 comprises a double gap electromagnet. The first magnet comprises a gap 48 and the second magnetic comprises a gap 49. Each magnet has a semi-circular outer portion and a common vertical portion 47 which in effect completes two electromagnets with two opposing gap fields $H_1$ and $H_2$. Thus, it will be understood that an equivalent to the novel double gap electromagnet shown in FIG. 12 may be produced by placing two individual magnets side by side so that the gaps are displaced in opposite polarity. The windings on the three legs 47A, 47 and 47B of the magnet are of such current polarity as to produce the fields as indicated by the arrow vectors 51 to 55. A single Hall effect sensor 56, identical to the sensor 29, is placed on the common leg 47 of the magnet means 40. A dummy sensor 57 identical to the sensor 56 is placed in one of the gaps 48 or 49. The field sensed by the dummy sensor 57 permits the calibration of the gap field $H_1$ and is also used as a cancellation means connected in a series with the sensor 56.

In the preferred mode of operation, the double gap electromagnet 40 is driven by an AC current source 65 which is of sufficient peak to peak magnitude to saturate the magnetic material 19 of the recording disk 17. During this first half cycle of the applied AC current, the magnetic layer 19 is continuously driven in one direction as shown by the magnetic vector arrows 58 and 59. After the magnetic material is saturated, during the first half of the AC cycle, a reversal takes place and during the second half of the AC cycle all of the arrows and vectors 58, 59 etc. shown in FIG. 12 are reversed. While this reversal and saturation is taking place, all of the signals are being continuously sensed and recorded as digital signals in a programmed computer controller 64 and the data taken may be analyzed so as to calculate the desired hysteretic properties as discussed hereinbefore.

A balance controller 62 is electrically connected to Hall effect sensors 56 and 57 shown having an output connected to sense amplifier 63. Sensor amplifier 63 is coupled to the processor controller 64 which in turn controls A.C. source 65, motor 25 etc. to effect a series or set of tests.

Balance means 62 is shown connected to the primary Hall effect sensor 56 and the dummy Hall effect sensor 57. Balance means 62 are employed to cancel out that portion of the signal produced by the double gap magnet 47. This signal may be 10,000 times larger than the flux signal sensed from the magnetized layer 19 and must be carefully balanced out before the signal resulting from the detection of the flux in the magnetic layer 19 may be properly sensed. The flux sensed from the magnetic layer 19 is amplified in sense amplifier 63 and these continuous signals are applied to controller processor 64 which coordinates the AC power means 65 as well as the motors 25 and 44 described hereinbefore.

Having explained a second preferred embodiment with reference to FIG. 12, it will now be understood that the testing apparatus shown in FIG. 11 no longer requires the vertical plate 39 and its support 41 because the sensing means 56 may be placed in the gap of the double gap electromagnet. Thus, the movable plate 42 only requires a lead screw 46 driven by motor 44 using this embodiment.

Further it will be understood that a laser and detector device 61 may be added to the FIG. 11 embodiment to provide a magneto-optic Kerr effect hysteresis loop measuring apparatus of the type shown in my U.S. Pat. No. 4,816,761. Thus, it will be understood that the aforementioned testing apparatus may be incorporated into the present invention and the same computer controller 64 may be employed for both testing apparatus.

What is claimed is:

1. Apparatus for nondestructively measuring the magnetic flux from hard magnetic films, comprising:

electromagnetic means for producing a strong magnetic field that is capable of magnetizing a spot on said hard magnetic film up to saturation to produce external magnetic flux, Hall effect sensor means positioned juxtaposed the magnetized spot on the hard magnetic film for coupling said external magnetic flux with the Hall effect sensor, means for varying the strength and direction of said magnetic field of said electromagnetic means and for varying the amplitude and polarity and the magnetization level of said spot being magnetized on said hard magnetic film, flux sensing means coupled in series with said Hall effect sensor means for discriminating between the background noise signals and said external magnetic flux from said hard magnetic film, electronic control means coupled to said flux sensing means for removing said background noise signals and for amplifying signals indicative of said external magnetic flux, and said electronic control means further comprising processor means for recording said magnetization levels in said magnetic film and for indicating the remanent magnetic flux (Mrt) and the remanent coercivity (Hrc) in said hard magnetic material.

2. Apparatus for measuring magnetic flux as set forth in claim 1 wherein said electronic control means comprises adjustable balance means for removing said background noise signals and amplifying signals indicative of the external magnetic flux.

3. Apparatus for measuring magnetic flux as set forth in claim 1 wherein said electromagnetic means comprises a double gap electromagnet having two gaps juxtaposed said spot being magnetized.

4. Apparatus for measuring magnetic flux as set forth in claim 1 wherein said electromagnetic means comprises means having opposing coils for providing opposing magnetic vectors in said hard magnetic film.

5. Apparatus for measuring magnetic flux as set forth in claim 3 wherein said flux sensing means comprises a dummy Hall effect sensor for balancing out the flux of said electromagnet which is substantially greater than said external flux from said hard magnetic films.

6. Apparatus for measuring magnetic flux as set forth in claim 3 wherein said Hall effect sensor means is located at a point juxtaposed the hard magnetic film and in an area between the two gaps of said double gap electromagnet.

7. Apparatus for measuring magnetic flux as set forth in claim 1 wherein said control processor means for further includes program means for varying said strong magnetic field and for recording a series of external magnetic flux levels.

8. Apparatus for measuring magnetic flux as set forth in claim 7 which further includes a pair of coils wound on said electromagnetic means for creating different levels of said magnetic fields in said hard magnetic film, and said control processor means being programmed for supplying variable current levels to a pairs of coils for creating a bipolar magnetic field in said hard magnetic film.

9. The method of continuously measuring the magnetic flux level from hard magnetic films comprising the steps of:

positioning a hard magnetic film to be tested adjacent to electromagnetic means having a pair of magnetic gaps, simultaneously producing two opposing strong magnetic fields in said magnet gaps which couple said hard magnetic film to provide two opposed magnetized areas in said hard magnetic film which may be driven into saturation and simultaneously produces external magnetic flux therebetween, providing electronic control means including a first Hall effect sensor means adjacent to said magnetized areas which is coupled to said external magnetic flux, electrically coupling dummy Hall effect sensor means located in at least one of said pair of magnet gaps to said first Hall effect sensor, and electrically balancing out the flux of said electromagnetic means sensed by said first Hall effect sensor so that only the balanced flux from said hard magnetic film is sensed by said electronic control means.

10. The method as set forth in claim 9 which further includes the step of:

cycling said two opposing strong magnetic fields to change the level of said external magnetic flux in said hard magnetic film.

11. The method as set forth in claim 10 which further includes that step of continuously recording the levels of said external magnetic flux resulting from changes in said two opposing strong magnetic fields.

12. The method as set forth in claim 11 which further includes the step of:

calculating the hysteretic properties of said hard magnetic film from the recorded levels of said external magnetic flux.

13. The method as set forth in claim 10 which further includes the step of:

moving said hard magnetic film relative to said electromagnetic means, and continuously recording the levels of said external magnetic flux resulting from changes in said two opposing strong magnetic fields at a plurality of continuous spots.

14. The method of measuring a plurality of magnetic flux levels in a hard magnetic film on a magnetic disk comprising the steps of:

positioning a hard magnetic film to be tested adjacent to a gap in an electromagnetic means, actuating said electromagnetic means to generate a strong magnetic field in said hard magnetic film sufficient to magnetize the area opposite said gap in a first direction, rotating said magnetic disk in the presence of said strong magnetic field to create a saturated magnetized annular ring portion in said hard magnetic film in a first direction, producing incremental strong magnetic fields in a second direction, which fields are opposite said first direction to magnetize a spot in said ring portion opposite said gap, reducing said magnetic field to zero, rotating said magnetized spot on said magnetic film to a position opposite a Hall effect sensor, and moving said magnetized spot past said Hall effect sensor to detect the magnetic flux being emitted from said magnetized spot.

15. The method as set forth in claim 14 which further includes the steps of magnetizing the same spot at different magnetic field levels, and detecting the magnetic flux emitted from the same spot at different magnetization levels to provide a set of said flux levels.

16. The method as set forth in claim 15 which further includes the steps of recording said set of flux levels, and analyzing said set of flux levels and automatically computing the remanent flux (Mrt) and/or the remanent coercivity (Hrc) and/or the switching field distribution (S*) as well as other hysteretic properties.

17. Apparatus for non-destructively measuring the magnetic flux from a hard magnetic film on a magnetic recording disk, comprising:

drive means for rotatably mounting said magnetic recording disk, electromagnetic means having gap means juxtaposed said hard magnetic film for producing a strong magnetic field that is capable of magnetizing a spot on said hard magnetic film up to saturation to produce different levels of external magnetic flux to be measured, control means for actuating said electromagnetic means and for rotating said recording disk to produce an annular ring area portion on said hard magnetic film that is saturated in a first direction, Hall effect sensor means located apart from said gap means and juxtaposed said annular ring area, said control means being activated to first saturate said annular ring in said first direction and after said recording disk has been stopped opposite said gap, and said magnetic field deactivated, being again activated in a second direction opposite said first direction to magnetize a spot in said annular ring area on said hard magnetic film to a predetermined level of magnetization, said control means being coupled to said drive means for rotatably moving said magnetized spot past said Hall effect sensor means in the presence of said external magnetic flux, and processor means in said control means for recording different levels of said external magnetic flux corresponding to different levels of magnetization of said spot on said magnetic film and for automatically computing the remanent flux (Mrt) and the remanent coercivity (Hrc) of said hard magnetic film.

18. Apparatus for measuring the magnetic flux as set forth in claim 17 wherein said electromagnetic means comprises a single gap magnet.

* * * * *